(12) United States Patent
Nakamura

(10) Patent No.: US 11,322,404 B2
(45) Date of Patent: May 3, 2022

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/592,401

(22) Filed: Oct. 3, 2019

(65) Prior Publication Data
US 2020/0111710 A1  Apr. 9, 2020

(30) Foreign Application Priority Data
Oct. 5, 2018  (JP) .............................. JP2018-189719

(51) Int. Cl.
| | | |
|---|---|---|
| *H01L 21/78* | (2006.01) | |
| *H01L 21/268* | (2006.01) | |
| *H01L 21/263* | (2006.01) | |
| *H01L 21/304* | (2006.01) | |
| *B28D 5/00* | (2006.01) | |

(52) U.S. Cl.
CPC ............ *H01L 21/78* (2013.01); *B28D 5/0005* (2013.01); *B28D 5/0011* (2013.01); *H01L 21/268* (2013.01); *H01L 21/2633* (2013.01); *H01L 21/304* (2013.01)

(58) Field of Classification Search
CPC ... H01L 21/2633; H01L 21/268; H01L 21/78; H01L 21/304; B28D 5/0005; B28D 5/0011
See application file for complete search history.

(56) References Cited

U.S. PATENT DOCUMENTS

| | | | | |
|---|---|---|---|---|
| 6,759,274 B2 * | 7/2004 | Arai | .................. | H01L 21/67132 |
| | | | | 257/E21.599 |
| 7,776,728 B2 * | 8/2010 | Yang | ..................... | H01L 21/268 |
| | | | | 438/584 |
| 2010/0267199 A1 * | 10/2010 | Hatakeyama | ....... | H01L 21/6836 |
| | | | | 438/107 |
| 2013/0248500 A1 * | 9/2013 | Shreter | .............. | B23K 26/0006 |
| | | | | 219/121.73 |

FOREIGN PATENT DOCUMENTS

| | | | | | |
|---|---|---|---|---|---|
| CN | 101982285 A | * | 3/2011 | | |
| JP | 2009290148 A | | 12/2009 | | |
| JP | 2016213318 A | * | 12/2016 | ........... | H01L 21/268 |
| JP | 2016213318 A | | 12/2016 | | |

* cited by examiner

*Primary Examiner* — Tuan A Hoang
(74) *Attorney, Agent, or Firm* — Greer Burns & Crain, Ltd.

(57) ABSTRACT

A wafer processing method includes applying a laser beam of such a wavelength as to be transmitted through a wafer to the wafer from a back surface of the wafer, with a focal point of the laser beam positioned at a predetermined point inside the wafer, to form division start points along streets, the division start point including a modified layer and a crack extending from the modified layer to a front surface of the wafer; and grinding the back surface of the wafer by a grinding wheel having a plurality of grindstones in an annular pattern, to thin the wafer and divide the wafer into individual device chips. In forming the division start points, a chuck table is heated to a predetermined temperature, whereby the cracks formed inside the wafer to extend from the modified layers to the front surface of the wafer are grown.

4 Claims, 4 Drawing Sheets

WAFER PROCESSING METHOD

BACKGROUND OF THE INVENTION

Field of the Invention

The present invention relates to a wafer processing method for dividing a wafer formed on a front surface thereof with a plurality of devices in a state of being partitioned by a plurality of intersecting streets into individual device chips.

Description of the Related Art

A wafer formed on a front surface thereof with a plurality of devices such as integrated circuits (ICs) and large scale integrations (LSIs) in a state of being partitioned by a plurality of intersecting streets is divided into individual device chips by a dicing apparatus, and the device chips are utilized for electric apparatuses such as mobile phones and personal computers.

In addition, there has been proposed a technology in which a laser beam of such a wavelength as to be transmitted through a wafer is applied to the wafer from a back surface side of the wafer, with a focal point of the laser beam positioned inside the wafer, to form modified layers along the streets, and thereafter the back surface of the wafer is ground to thin the wafer and to grow cracks extending from the modified layers to the front surface, thereby dividing the wafer into the individual device chips (see, for example, Japanese Patent Laid-open No. 2009-290148).

Further, the present applicant has proposed a technology in which a wafer formed with modified layers is thereafter heated, for effectively forming cracks extending to the front surface from the modified layers formed along the streets (see, for example, Japanese Patent Laid-open No. 2016-213318).

SUMMARY OF THE INVENTION

While attempts have been made to divide a wafer into individual device chips by use of the technologies described in Japanese Patent Laid-open No. 2009-290148 and Japanese Patent Laid-open No. 2016-213318, the cracks extending from the modified layers to the front surface of the wafer may not be formed appropriately. In that case, an attempt to grind the back surface of the wafer not formed appropriately with the cracks for dividing the wafer into individual device chips would result in that device chips with desired quality cannot be obtained.

Accordingly, it is an object of the present invention to provide a wafer processing method by which a back surface of a wafer can be ground to thin the wafer and to properly divide the wafer into individual device chips.

In accordance with an aspect of the present invention, there is provided a wafer processing method for dividing a wafer formed on a front surface thereof with a plurality of devices in a state of being partitioned by a plurality of intersecting streets into individual device chips, the wafer processing method including: a protective tape disposing step of disposing a protective tape on the front surface of the wafer; a wafer holding step of holding the wafer on a chuck table for holding and heating the wafer, with the protective tape side facing the chuck table and with a back surface of the wafer exposed; a division start point forming step of applying a laser beam of such a wavelength as to be transmitted through the wafer to the wafer from the back surface of the wafer, with a focal point of the laser beam positioned at a predetermined point inside the wafer, to form division start points along the streets, the division start point including a modified layer and a crack extending from the modified layer to the front surface of the wafer, after the wafer holding step is performed; and a dividing step of grinding the back surface of the wafer by a grinding wheel having a plurality of grindstones in an annular pattern to thin the wafer and divide the wafer into the individual device chips, after the division start point forming step, in which in the division start point forming step, the chuck table is heated to a predetermined temperature, whereby the cracks formed inside the wafer to extend from the modified layers to the front surface are grown.

Preferably, in the division start point forming step, the predetermined temperature is 40° C. to 120° C.

According to the wafer processing method of the present invention, in the division start point forming step, the chuck table is heated to a predetermined temperature, and the cracks extending to the front surface from the modified layers formed inside the wafer are grown. Therefore, a shrinking force of the protective tape disposed on the front surface of the wafer is liberated by the heating, so that when the modified layers are formed by the laser beam, the cracks extending from the modified layers to the front surface of the wafer can be properly grown.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
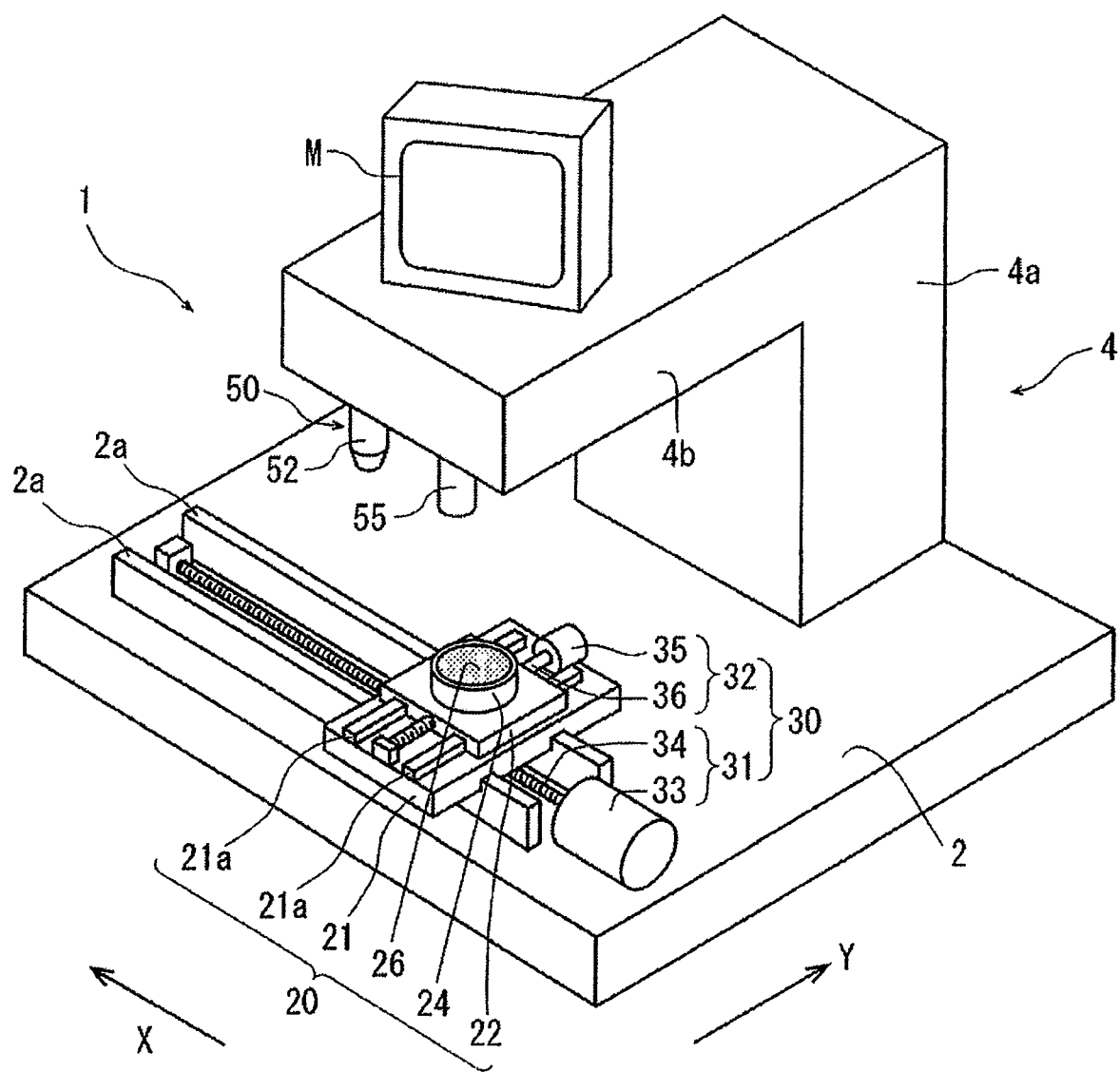
FIG. 1 is a general perspective view of a laser processing apparatus.

An embodiment of a wafer processing method carried out based on the present invention will be described in more detail below, referring to the attached drawings. FIG. 1 illustrates a general perspective view of a laser processing apparatus 1 suitable for the wafer processing method according to the present embodiment.

The laser processing apparatus 1 depicted in FIG. 1 includes a holding unit 20 that holds a circular-shaped workpiece (wafer), a moving mechanism 30 that moves the holding unit 20, a laser beam applying unit 50 that applies a laser beam to the workpiece held by the holding unit 20, an imaging unit 55 that images the workpiece held by the holding unit 20, and a display apparatus M.

The holding unit 20 is disposed on a base 2 as a base of the laser processing apparatus 1, and includes: a rectangular X-axis direction movable plate 21 mounted to be movable in an X-axis direction indicated by an arrow X in the figure; a rectangular Y-axis direction movable plate 22 mounted on the X-axis direction movable plate 21 to be movable in a Y-axis direction indicated by an arrow Y in the figure; a chuck table 24 disposed on an upper surface of the Y-axis direction movable plate 22 and configured to be rotatable by driving means (not illustrated); and a suction chuck 26 constituting an upper surface of the chuck table 24 and formed from a gas-permeable porous material such as a porous ceramic. Heating means such as a heater to be described later is incorporated inside the chuck table 24, as a function to heat the surface of the suction chuck 26 to a predetermined temperature.

The moving mechanism 30 includes an X-axis feeding mechanism 31 that puts the holding unit 20 into processing feeding in the X-axis direction, and a Y-axis feeding mechanism 32 that puts the holding unit 20 into indexing feeding in the Y-axis direction. The X-axis feeding mechanism 31 converts a rotational motion of a pulse motor 33 into a rectilinear motion through a ball screw 34 and transmits the rectilinear motion to the X-axis direction movable plate 21, whereby the X-axis direction movable plate 21 is advanced and retreated in the X-axis direction along guide rails 2a on the base 2. The Y-axis feeding mechanism 32 converts a rotational motion of a pulse motor 35 into a rectilinear motion through a ball screw 36 and transmits the rectilinear motion to the Y-axis direction movable plate 22, whereby the Y-axis direction movable plate 22 is advanced and retreated in the Y-axis direction along guide rails 21a on the X-axis direction movable plate 21. Position detection means (not illustrated) is disposed on the moving mechanism 30 to detect positions in the X-axis direction, the Y-axis direction and a rotating direction of the chuck table 24, and the detected positions are fed back to a control unit (not illustrated), whereby the chuck table 24 can be moved to a desired position.

A frame body 4 is erected on a lateral side of the moving mechanism 30. The frame body 4 includes a vertical wall section 4a disposed on the base 2, and a horizontal wall section 4b extending horizontally from an upper end portion of the vertical wall section 4a. An optical system (not illustrated) inclusive of a laser oscillator of a laser beam applying unit 50 is incorporated inside the horizontal wall section 4b of the frame body 4. A focusing unit or a condenser 52 constituting part of the laser beam applying unit 50 is disposed on a lower surface of a tip portion of the horizontal wall section 4b, and a focusing lens (not illustrated) that focuses a laser beam is incorporated inside the focusing unit 52. The laser beam emitted from the laser oscillator of the laser beam applying unit 50 passes through the optical system (not illustrated), and is focused by the focusing unit 52, to form a focal spot at a desired position of the workpiece held by the chuck table 24 of the holding unit 20.

The imaging unit 55 is disposed on the lower surface of the tip portion of the horizontal wall section 4b at a position adjacent to the focusing unit 52 in the X-axis direction, and images the workpiece held by the holding unit 20 from a direction opposite to the holding unit 20. The imaging unit 55 includes an infrared imaging element (infrared charge-coupled device (CCD)) (not illustrated) that images using infrared rays, and infrared applying means (not illustrated) that applies infrared rays to the workpiece, and the imaging unit 55 is connected to a control unit (not illustrated) that controls operating parts of the laser processing apparatus 1. A signal of an image picked up by the imaging unit 55 is sent to the control unit. Note that depending on the kind of the workpiece, the imaging unit 55 may include visible beam applying means, and an ordinary imaging element (CCD) that images visible beams.

The display apparatus M is disposed on the horizontal wall section 4b, is connected to the control unit (not illustrated), displays various kinds of processing information outputted from the control unit, such as a wavelength, a repetition frequency, a focal position and a spot diameter of the laser beam, and image information on the wafer obtained by imaging by the imaging unit 55, etc., and has a touch panel function for receiving an operator's operation and sending a signal to the control unit.

The laser processing apparatus 1 generally has the above-mentioned configuration. The wafer processing method of the embodiment of the present invention carried out by use of the laser processing apparatus 1 will be described below.
<Protective Tape Disposing Step>

Figure 2:
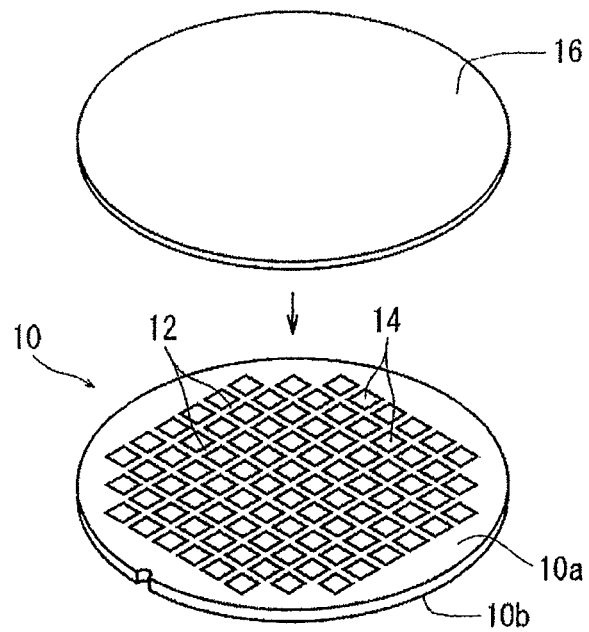
FIG. 2 is a perspective view of a wafer to be processed by an embodiment of the present invention, and a protective tape.

In performing the wafer processing method of the present embodiment, first, as depicted in FIG. 2, a wafer 10 formed from a semiconductor, for example, silicon (Si) and formed on a front surface 10a thereof with a plurality of devices 14 in a state of being partitioned by a plurality of intersecting streets 12 is prepared. After the wafer 10 is prepared, a protective tape 16 is disposed on the front surface 10a side. The protective tape 16 includes a flexible film-shaped base material, and a glue layer formed on one side of the base material, and is adhered to the front surface 10a side of the wafer 10 through the glue layer. For the base material, for example, a polyolefin (PO) may be used, but the PO is not limitative, and polyethylene terephthalate (PET), polyvinyl chloride, polystyrene and the like may also be used. For the glue layer, there may be used, for example, silicone rubber, acrylic materials, epoxy materials and the like. In addition, the protective tape 16 is not limited to those including the base material and the glue layer; a sheet of a polyolefin material or a sheet of a polyester material that exhibits a sticky force when heated to the vicinity of a melting point thereof may also be used. In the case where a sheet of a polyolefin material or a sheet of a polyester material is used as the protective tape 16, the glue layer can be omitted. By this, a protective tape disposing step is completed.
<Wafer Holding Step>

Figure 3:
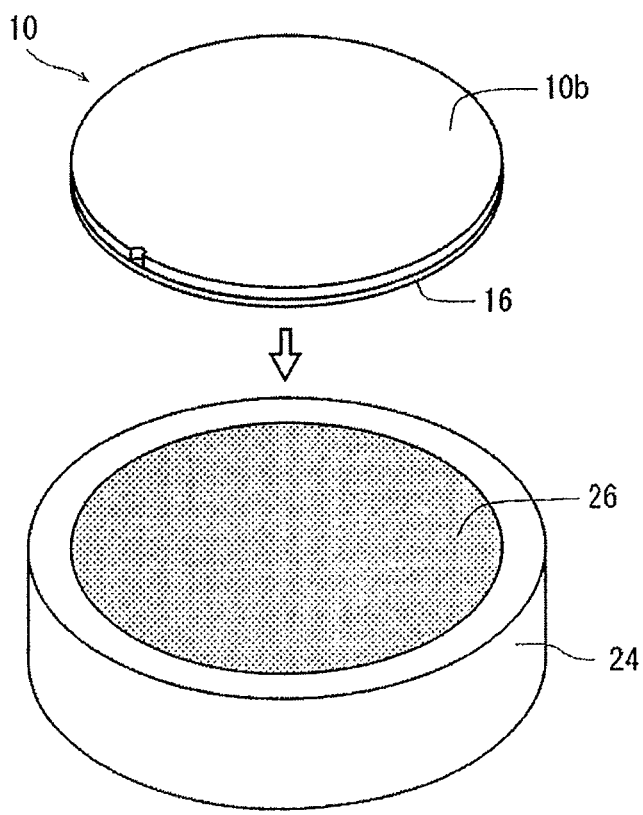
FIG. 3 is a perspective view depicting a manner in which a wafer is held by a chuck table of the laser processing apparatus of FIG. 1.

After the protective tape disposing step is completed as above-mentioned, as illustrated in FIG. 3 the wafer is mounted on the chuck table 24 of the laser processing apparatus 1, with the protective tape 16 side facing the chuck table 24, and suction means (not illustrated) is operated to suction hold the wafer, with a back surface 10b of the wafer exposed to the upper side. By this, a wafer holding step is completed.
<Division Start Point Forming Step>

Figure 4A:
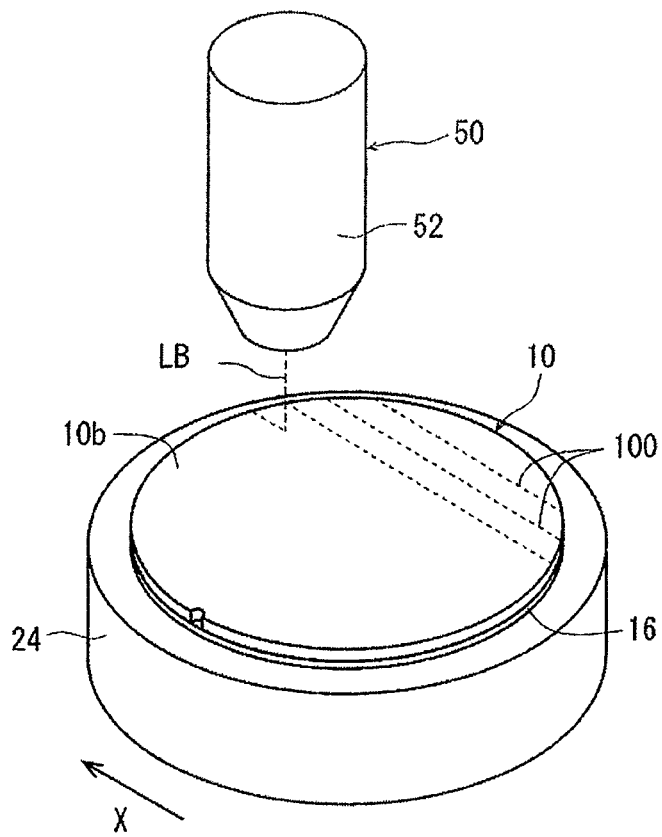
FIG. 4A is a perspective view depicting a manner in which a division start point forming step is carried out by the laser processing apparatus depicted in FIG. 1.
Figure 4B:
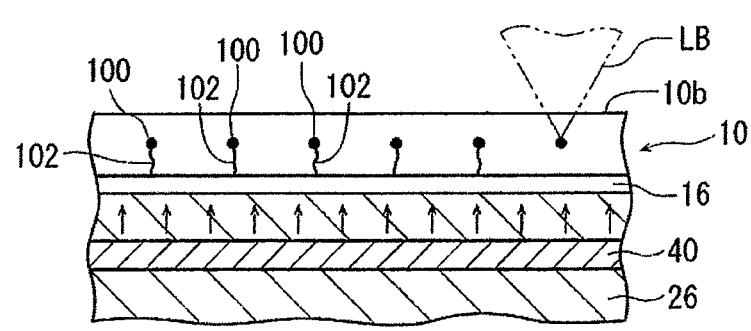
FIG. 4B is a partial enlarged sectional view of the wafer held on the chuck table.

After the wafer holding step is completed, a division start point forming step is conducted in which, as depicted in FIG. 4A, a laser beam LB is applied from the laser beam applying unit 50 possessed by the laser processing apparatus 1, to form modified layers serving as division start points inside the wafer 10 along the streets 12. More specifically, first, imaging is conducted by applying infrared rays from the imaging unit 55 to the back surface 10b of the wafer 10, whereby alignment between the position to which to apply the laser beam LB and the street 12 of the wafer 10 is carried out. After the alignment is conducted, heating means 40 incorporated in the chuck table 24 as depicted in FIG. 4B is operated. The heating means 40 includes an electric heater and a temperature sensor, and heats the suction chuck 26 constituting the upper surface of the chuck table 24 to a predetermined temperature (for example, 80° C.) set in the control unit (not illustrated) and keeps the suction chuck 26 at that temperature.

Figure 4C:
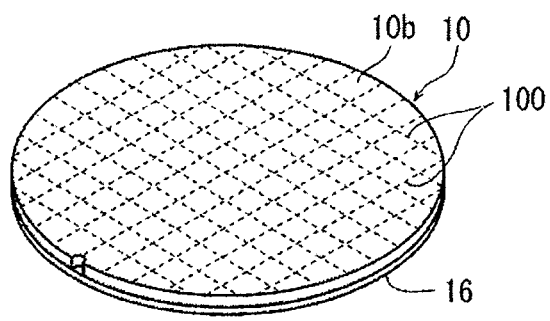
FIG. 4C is a perspective view of the wafer in a state in which the division start point forming step is completed.

After the chuck table 24 is heated to the predetermined temperature, the laser beam applying unit 50 of the laser processing apparatus 1 is started, the laser beam LB of such a wavelength as to be transmitted through the wafer 10 is emitted from a laser oscillator (omitted in illustration) disposed in the laser beam applying unit 50 from the back surface 10b side of the wafer 10, with the focal point of the laser beam LB positioned at a predetermined height position inside the wafer 10 through the focusing unit 52, the laser beam LB is applied along the street 12, and the chuck table 24 is moved at a predetermined processing feeding speed in the X-axis direction indicated by the arrow X. Then, the laser beam applying unit 50, the X-axis feeding mechanism 31 and the Y-axis feeding mechanism 32 for moving the chuck table 24, the rotating means (not illustrated) rotating the chuck table 24, etc. are controlled, to form modified layers 100 and cracks 102 serving as division start points along all the streets 12 on the wafer 10 as depicted in FIGS. 4B and 4C. By this, the division start point forming step is completed.

Note that laser processing conditions in which the above-mentioned division start point forming step is carried out are set, for example, as follows.
  Wavelength: 1,342 nm
  Repetition frequency: 60 kHz
  Average output: 1 W
  Processing feeding speed: 600 mm/s
<Dividing Step>

After the division start point forming step is completed as above-mentioned, a dividing step is carried out in which the back surface of the wafer 10 is ground to thin the wafer 10 and divide the wafer 10 into individual device chips 14'. This will be described more specifically, referring to FIGS. 5A and 5B.

Figure 5A:
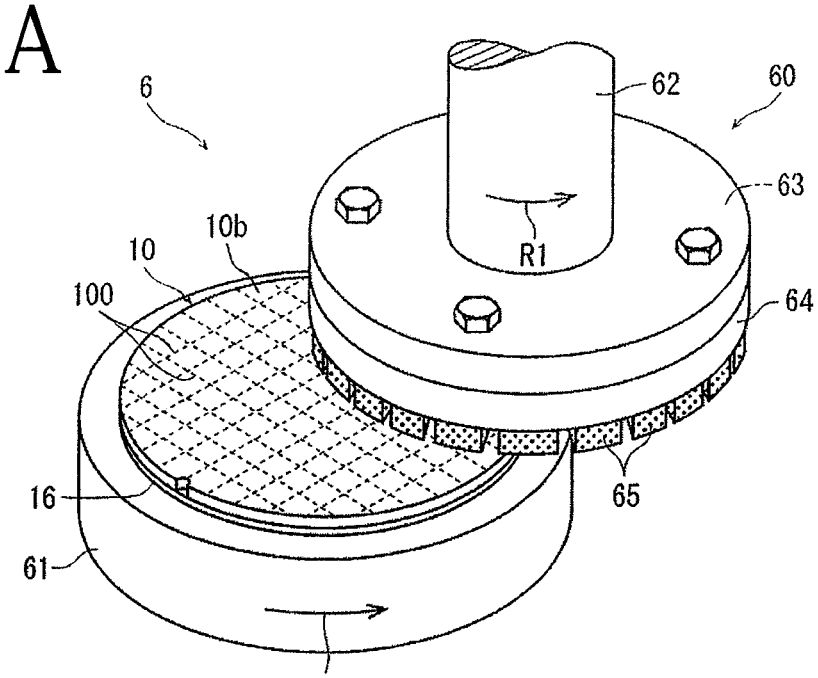
FIG. 5A is a perspective view depicting a manner in which the wafer is subjected to a dividing step.

After the division start point forming step is completed, the wafer 10 is carried from the chuck table 24 of the laser processing apparatus 1 to a grinding apparatus 6 (general view is omitted) depicted in FIG. 5A. Then, the wafer 10 is mounted on a chuck table 61 possessed by the grinding apparatus 6, with the back surface 10b side exposed to the upper side, and a suction force of suction means (not illustrated) is made to act on a holding surface of the chuck table 61, to suction hold the wafer 10.

As illustrated in FIG. 5A, the grinding apparatus 6 includes a grinding unit 60 grinding and thinning the wafer 10 mounted on the chuck table 61. The grinding unit 60 includes a rotary spindle 62 rotated by a rotational drive mechanism (not illustrated), a mounter 63 mounted to a lower end of the rotary spindle 62, and a grinding wheel 64 mounted to a lower surface of the mounter 63, with a plurality of grindstones 65 arranged in an annular pattern on a lower surface of the grinding wheel 64.

Figure 5B:
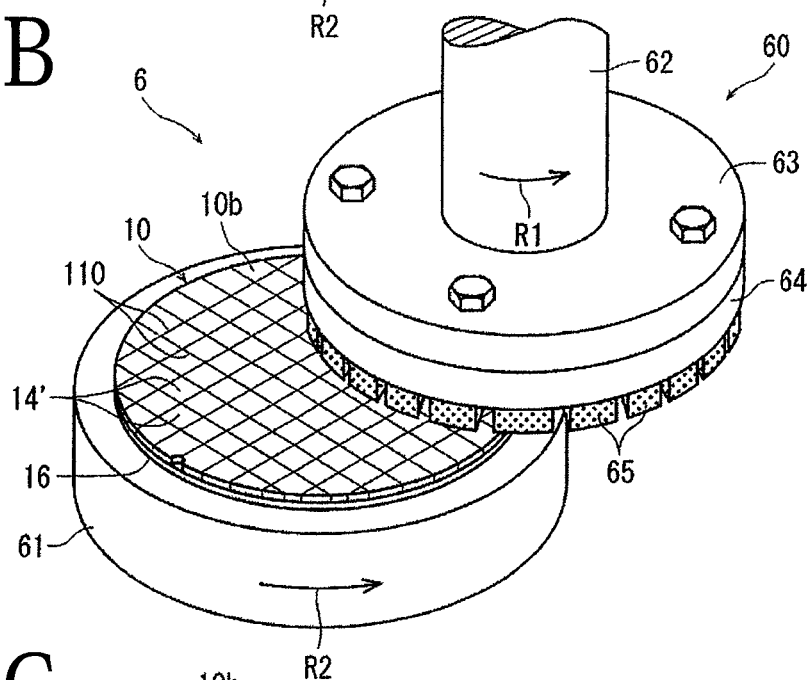
FIG. 5B is a perspective view depicting a manner in which the wafer is divided into individual device chips by the dividing step.
Figure 5C:
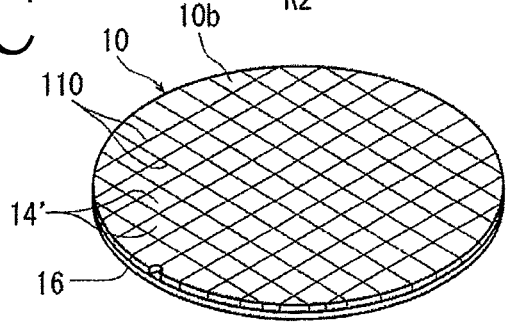
FIG. 5C is a perspective view of the wafer in a state in which the dividing step is completed.

After the wafer 10 is suction held onto the chuck table 61 as above-mentioned, the rotary spindle 62 is rotated at, for example, 3,000 rpm in the direction indicated by an arrow R1 in FIG. 5A, and the chuck table 61 is rotated at, for example, 300 rpm in the direction indicated by an arrow R2 in FIG. 5A. Then, the grindstones 65 are brought into contact with the back surface 10b of the wafer 10, and put into grinding feeding in a downward direction, or a direction perpendicular to the chuck table 61 at a grinding feeding speed of, for example, 1 μm/s. In this instance, the grinding can be conducted while measuring the thickness of the wafer 10 by a measurement gauge (not illustrated), and the back surface 10b side of the wafer 10 is ground, as depicted in FIG. 5B, to such an extent that the modified layer 100 is removed, or, for example, until the thickness of the wafer 10 becomes 60 μm, whereby dividing lines 110 for completely dividing the wafer 10 into the individual device chips 14' are formed. Since the wafer 10 is ground in the state of having been formed with the modified layers 100 and the cracks 102 along all the streets 12 as above-mentioned, the grinding to the above-mentioned thickness results in that the wafer 10 is properly divided into the individual device chips 14', without deterioration of quality, and the dividing step is completed (see FIG. 5C). After the dividing step is completed, the wafer 10 in the state of being held by the protective tape 16 is sent, for example, to a step of picking up the individual device chips 14'.

In the present embodiment, as illustrated in FIG. 4B, the chuck table 24 is provided with the heating means 40, and the suction chuck 26 is heated to 80° C., so that cracks 102 are favorably formed directly downward from the modified layers 100 formed by application of the laser beam LB. The reason for this is assumed that since the wafer 10 and the protective tape 16 are heated by the chuck table 24, a shrinking force of the protective tape 16 is liberated by the heating, and, at the time when the modified layers 100 are formed inside the wafer 10 by the laser beam LB, an environment for the cracks 102 to easily grow from the modified layers 100 to the front surface 10a side is formed. Thus, according to the method in which the protective tape 16 adhered to the wafer 10 is heated in accordance with the application of the laser beam LB, the crack 102 can be made to grow more favorably, as compared to the case where the modified layers 100 are formed in the wafer 10 in a non-heated environment and thereafter the wafer 10 is heated. Note that the temperature at the time of heating the chuck table 24 is not limited to the above-mentioned 80° C., but may be appropriately regulated in consideration of the materials, thickness and the like of the wafer 10 and the protective tape 16. The temperature in that case is preferably set in the range of 40° C. to 120° C.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer formed on a front surface thereof with a plurality of devices in a state of being partitioned by a plurality of intersecting streets into individual device chips, the wafer processing method comprising:
   a protective tape disposing step of disposing a protective tape on the front surface of the wafer;
   a wafer holding step of holding the wafer on a chuck table for holding and heating the wafer, with the protective tape side facing the chuck table and with a back surface of the wafer exposed;
   a division start point forming step of heating the chuck table to a predetermined temperature and applying a laser beam of such a wavelength as to be transmitted through the wafer to the wafer from the back surface of the wafer, with a focal point of the laser beam positioned at a predetermined point inside the wafer, to form division start points along the streets, the division start point including a modified layer and a crack extending from the modified layer to the front surface of the wafer, after the wafer holding step is performed; and a dividing step of grinding the back surface of the wafer by a grinding wheel having a plurality of grindstones in an annular pattern to thin the wafer and divide the wafer into the individual device chips, after the division start point forming step, wherein in the division start point forming step, the chuck table is heated to the predetermined temperature prior to applying the laser beam to the wafer, whereby the cracks formed inside the wafer to extend from the modified layers to the front surface are grown, and wherein in the division start point forming step, the predetermined temperature is 40° C. to 80° C.

2. The wafer processing method according to claim 1, wherein the modified layers formed during the division start point forming step do not extend to reach the front surface of the wafer.

3. A wafer processing method for dividing a wafer formed on a front surface thereof with a plurality of devices in a state of being partitioned by a plurality of intersecting streets into individual device chips, the wafer processing method comprising:

a protective sheet disposing step of disposing a protective sheet on the front surface of the wafer, wherein the protective sheet comprises a polyolefin or polyester material;

a wafer holding step of holding the wafer on a chuck table for holding and heating the wafer, with the protective sheet side facing the chuck table and with a back surface of the wafer exposed;

a division start point forming step of heating the chuck table to a predetermined temperature and applying a laser beam of such a wavelength as to be transmitted through the wafer to the wafer from the back surface of the wafer, with a focal point of the laser beam positioned at a predetermined point inside the wafer, to form division start points along the streets, the division start point including a modified layer and a crack extending from the modified layer to the front surface of the wafer, after the wafer holding step is performed; and a dividing step of grinding the back surface of the wafer by a grinding wheel having a plurality of grindstones in an annular pattern to thin the wafer and divide the wafer into the individual device chips, after the division start point forming step, wherein in the division start point forming step, the chuck table is heated to the predetermined temperature prior to applying the laser beam to the wafer, whereby the cracks formed inside the wafer to extend from the modified layers to the front surface are grown, and wherein in the division start point forming step, the predetermined temperature is 40° C. to 80° C.

4. The wafer processing method according to claim 3, wherein the modified layers formed during the division start point forming step do not extend to reach the front surface of the wafer.

* * * * *